US005764532A

United States Patent [19]
Patel

[11] Patent Number: 5,764,532
[45] Date of Patent: Jun. 9, 1998

[54] AUTOMATED METHOD AND SYSTEM FOR DESIGNING AN OPTIMIZED INTEGRATED CIRCUIT

[75] Inventor: Parsotam T. Patel, Austin, Tex.

[73] Assignee: International Business Machines Corporation, Armonk, N.Y.

[21] Appl. No.: 498,328

[22] Filed: Jul. 5, 1995

[51] Int. Cl.⁶ ............................................. G06F 17/50
[52] U.S. Cl. ........................ 364/491; 364/490; 364/489
[58] Field of Search ........................... 395/500; 364/578, 364/488–491

[56] References Cited

U.S. PATENT DOCUMENTS

| | | |
|---|---|---|
| 4,593,363 | 6/1986 | Burstein et al. |
| 4,698,760 | 10/1987 | Lemback et al. ............ 364/490 |
| 4,701,860 | 10/1987 | Mader . |
| 4,792,909 | 12/1988 | Serlet . |
| 4,890,238 | 12/1989 | Klein et al. |
| 4,949,275 | 8/1990 | Nonaka . |
| 5,119,314 | 6/1992 | Hotta et al. |
| 5,150,309 | 9/1992 | Shaw et al. |
| 5,157,618 | 10/1992 | Ravindra et al. |
| 5,164,907 | 11/1992 | Yabe . |
| 5,187,668 | 2/1993 | Okude et al. |
| 5,208,764 | 5/1993 | Rusu et al. |
| 5,212,653 | 5/1993 | Tanaka . |
| 5,218,551 | 6/1993 | Agrawal et al. |
| 5,222,031 | 6/1993 | Kaida . |
| 5,283,753 | 2/1994 | Schucker et al. |
| 5,349,542 | 9/1994 | Brasen et al. ............ 364/578 |
| 5,371,684 | 12/1994 | Ladonato et al. |
| 5,392,221 | 2/1995 | Donath et al. |
| 5,404,312 | 4/1995 | Tawada ................... 364/491 |
| 5,459,673 | 10/1995 | Carmean et al. ............ 364/489 |
| 5,507,029 | 4/1996 | Granato et al. ............ 395/500 |
| 5,521,837 | 5/1996 | Frankle et al. ............ 364/491 |
| 5,596,605 | 1/1997 | Steinweg et al. ............ 364/490 |

OTHER PUBLICATIONS

Brechling, George E., "Automatic Circuit Generation . . ." Nov. 4, 1975, 940 O.G. 11.

*Primary Examiner*—Vincent N. Trans
*Attorney, Agent, or Firm*—Anthony V. S. England; Brian F. Russell; Andrew J. Dillon

[57] ABSTRACT

An automated method and system for designing an integrated circuit are disclosed which construct an initial substrate layout of the integrated circuit in response to receipt of a high-level functional description of an integrated circuit. The initial substrate layout, which includes a number of subcircuits electrically connected by a number of interconnects, is constructed based upon estimated timing characteristics of the subcircuits. Next, particular subcircuits are arranged to optimize performance of the substrate layout of the integrated circuit. Performance characteristics of the substrate layout, including timing characteristics of the number of subcircuits and resistive and capacitive characteristics of the number of interconnects, are then determined. In response to a determination of the performance characteristics of the substrate layout, operating power levels of selected subcircuits and resistances of selected interconnects are adjusted to optimize performance of the substrate layout. Thereafter, the step of determining performance characteristics of the substrate layout is repeated. In response to the repeated determination of the performance characteristics of the substrate layout, routing of the number of interconnects electrically connecting the number of subcircuits is finalized. Thus, performance of the substrate layout of the integrated circuit is optimized by iteratively refining the initial substrate layout utilizing performance characteristic data.

24 Claims, 4 Drawing Sheets

AUTOMATED METHOD AND SYSTEM FOR DESIGNING AN OPTIMIZED INTEGRATED CIRCUIT

BACKGROUND OF THE INVENTION

1. Technical Field

The present invention relates in general to a method and system for computer-aided design and in particular to a method and system for designing an integrated circuit. Still more particularly, the present invention relates to a method and system for designing an integrated circuit which efficiently construct an optimized integrated circuit layout by iteratively refining an initial integrated circuit layout.

2. Description of the Related Art

Because of the complexity of modern integrated circuits, and in particular processors, computer-aided design is often employed to efficiently develop integrated circuit layouts. Computer-aided design (CAD) tools typically analyze the logic which implements processor functions as an interconnected network of subcircuits which each perform either a control or data flow function. Because of the difficulty in reducing a set of control (Boolean) equations to an actual integrated circuit layout, control subcircuits are typically designed utilizing random logic macros (RLM), which provide an efficient, error free, and easily modifiable subcircuit design. Although commercially available RLMs enable a circuit designer to quickly implement a desired control function, RLM design methodologies utilize standard cell sizes and wiring methods, and therefore do not provide a subcircuit design optimized for the particular processor in which the resulting control subcircuit will be utilized.

In contrast to control subcircuits, data flow subcircuits are typically designed utilizing semi-custom macros called "off the shelf" (OTS) macros. Each OTS macro represents an individually designed data flow subcircuit that performs an associated data flow function. OTS macros provide a semi-custom design since the data flow subcircuit represented by a particular OTS macro is repeated within the overall processor layout wherever the associated data flow function is required.

Referring now to FIG. 4, there is depicted a flowchart of a conventional process utilized by a computer-aided design system to lay out an integrated circuit. As illustrated, the process begins at block 100, which depicts a user entering a high-level design of an integrated circuit into a CAD system. The high-level design usually includes a number of data flow functions, which are typically described by OTS macro calls, and a number of control functions, which are described by a set of Boolean equations. At block 102, the data flow subcircuits generated by the OTS macro calls are arranged. Placement of the data flow subcircuits is performed manually by the user in many conventional CAD systems and automatically in more sophisticated CAD systems. While the data flow subcircuits are arranged at block 102, the CAD system synthesizes control subcircuits from the Boolean control equations utilizing RLMs as illustrated at block 104. The control subcircuits generated at block 104 are refined iteratively utilizing timing constraints and interconnect resistance and capacitance estimates determined at block 106. After the control subcircuits have reached predetermined minimum performance requirements, the process proceeds to block 108, which illustrates arranging the control subcircuits. Thereafter, the process proceeds to block 110, which depicts routing the interconnect between appropriate control and data flow subcircuits to complete the layout of the integrated circuit. Finally, the process proceeds to block 112, which depicts analyzing the resistance, capacitance, and performance of the final integrated circuit layout to determine if the final design meets the user's performance specifications.

As will be appreciated by those skilled in the art, although the conventional automated process for designing integrated circuits provides a relatively efficient, flexible and error-free method for implementing high-level integrated circuit designs, the circuit layouts produced by conventional CAD systems typically are not optimized to achieve maximum performance due to the utilization of standardized subcircuits generated by RLMs and OTS macros. Although the performance of an integrated circuit could theoretically be optimized by utilizing fully customized subcircuits, the complexity of modern integrated circuits, and in particular processors, makes customized layouts impractical.

Consequently, it would be desirable to provide an improved method and system for automatically designing an integrated circuit which optimize the performance of an integrated circuit layout.

SUMMARY OF THE INVENTION

It is therefore one object of the present invention to provide an improved method and system for computer-aided design.

It is another object of the present invention to provide an improved method and system for designing an integrated circuit.

It is yet another object of the present invention to provide an improved method and system for designing an integrated circuit which efficiently construct an optimized integrated circuit layout by iteratively refining an initial integrated circuit layout.

The foregoing objects are achieved as is now described. An automated method and system for designing an integrated circuit are disclosed which construct an initial substrate layout of the integrated circuit in response to receipt of a high-level functional description of an integrated circuit. The initial substrate layout, which includes a number of subcircuits electrically connected by a number of interconnects, is constructed based upon estimated timing characteristics of the subcircuits. Next, particular subcircuits are arranged to optimize performance of the substrate layout of the integrated circuit. Performance characteristics of the substrate layout, including timing characteristics of the number of subcircuits and resistive and capacitive characteristics of the number of interconnects, are then determined. In response to a determination of the performance characteristics of the substrate layout, operating power levels of selected subcircuits and resistances of selected interconnects are adjusted to optimize performance of the substrate layout. Thereafter, the step of determining performance characteristics of the substrate layout is repeated. In response to the repeated determination of the performance characteristics of the substrate layout, routing of the number of interconnects electrically connecting the number of subcircuits is finalized. Thus, performance of the substrate layout of the integrated circuit is optimized by iteratively refining the initial substrate layout utilizing performance characteristic data.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
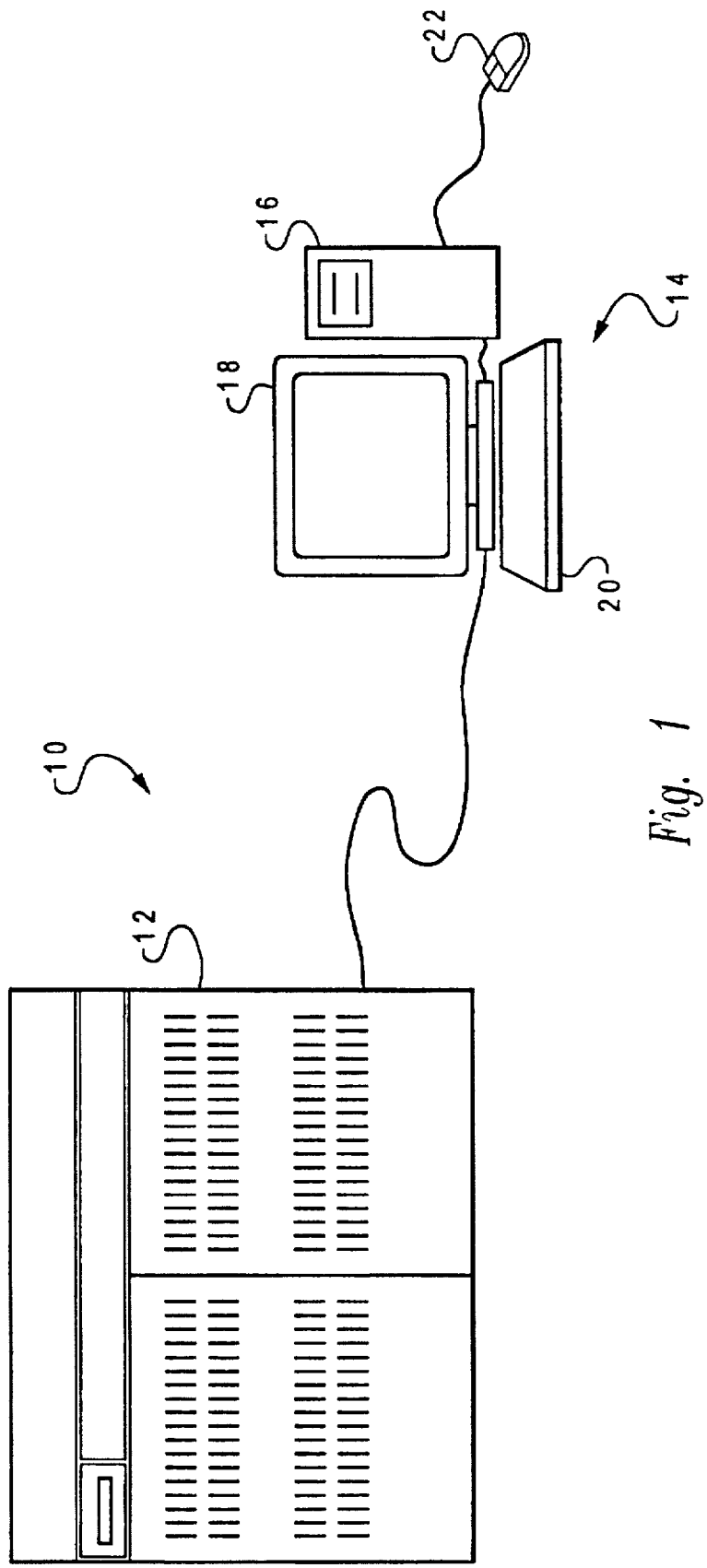
FIG. 1 illustrates a preferred embodiment of a data processing system with which the method and system of the present invention can be advantageously utilized.

With reference now to the figures, and in particular with reference to FIG. 1, there is illustrated a preferred embodiment of a multiprocessor data processing system which can be advantageously utilized in conjunction with the method and system of the present invention. As illustrated, data processing system 10 comprises system unit 12 and one or more local nodes 14, which include personal computer 16, display 18, keyboard 20, and mouse 22. As is well-known to those skilled in the art, a user inputs data to personal computer 16 utilizing keyboard 20, mouse 22 or other suitable input device. The user may then process the data locally utilizing personal computer 16, or transmit the data from personal computer 16 to system unit 12 or another node 14 utilizing well-known networking techniques. System unit 12 and personal computer 16 output data to a user via display device 18.

Figure 2:
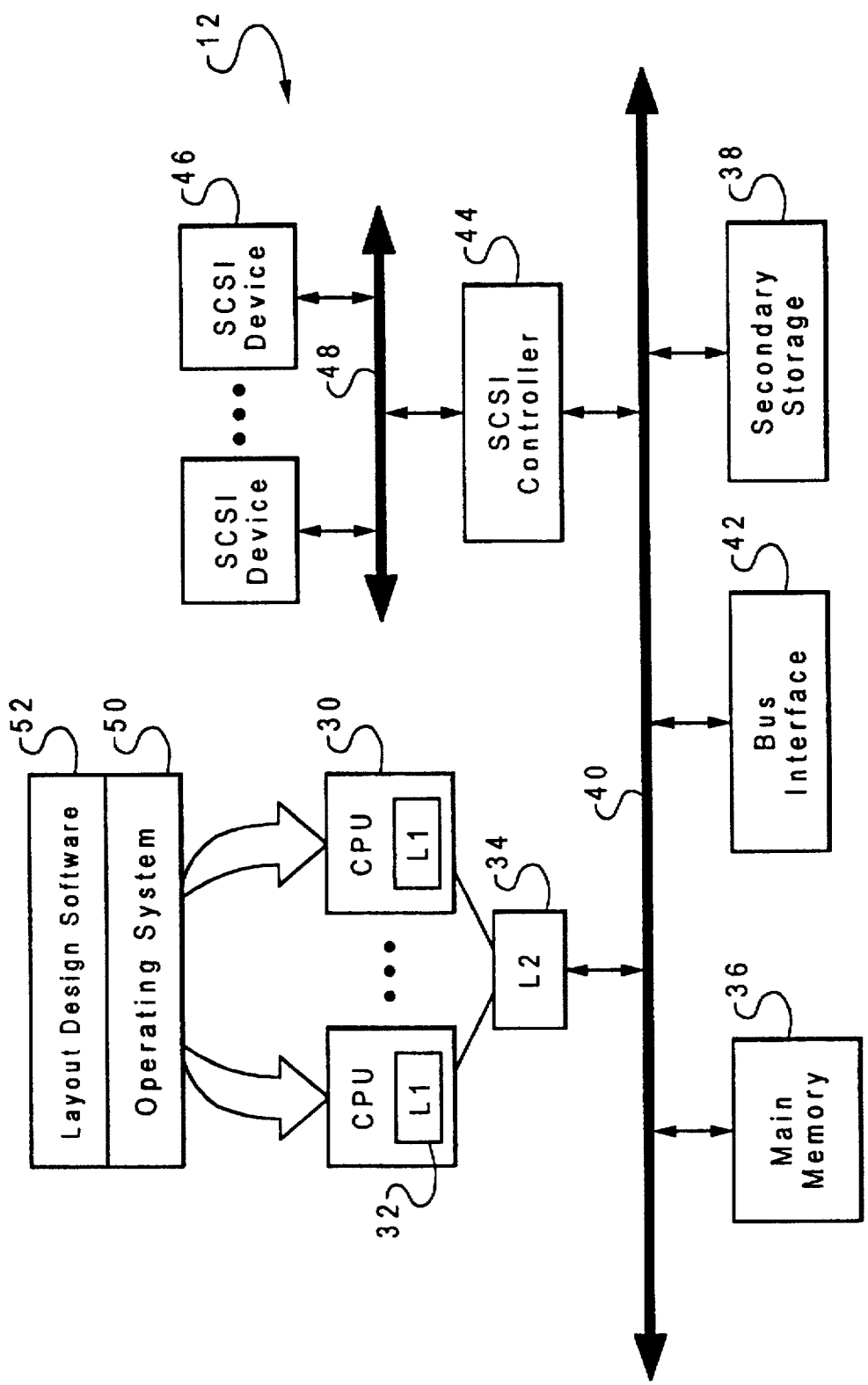
FIG. 2 depicts a block diagram of the system unit of the data processing system illustrated in FIG. 1.

Referring now to FIG. 2, there is depicted a block diagram of system unit 12, which is preferably a superscalar multiprocessor computer, such as the IBM RISC System/6000. As illustrated, system unit 12 includes a number of CPUs 30, which each include an on-board level one (L1) cache 32. Each CPU 30 can access data stored within its associated L1 cache 32, shared level two (L2) cache 34, main memory 36, or secondary storage 38. As will be understood by those skilled in the art, L1 caches 32 and L2 cache 34 comprise relatively small amounts of high speed memory which store software segments and data frequently accessed by CPUs 30. Software segments and data that are required less frequently are stored within main memory 36 or are paged to secondary storage 38 by a virtual memory manager (not illustrated) and may be accessed by CPUs 30 via system bus 40.

System unit 12 also includes bus interface 42 and SCSI controller 44. Bus interface 42 enables system unit 12 to communicate with one or more nodes 14. SCSI controller 44 provides expansion capabilities to system unit 12. As depicted, a user may attach one or more SCSI devices 46 to SCSI controller 44 via peripheral bus 48. As will be understood by those skilled in the art, system unit 12 includes additional devices which have been omitted for the sake of simplicity and are not required for an understanding of the present invention.

Operation of system unit 12 is controlled by a suitable operating system 50, such as AIX (Advanced Interactive eXecutive). Operating system 50 comprises a background program running on each of CPUs 30 which provides an application programming interface for layout design software 52 and other application software. According to the present invention, a programmer can utilize layout design software 52 to design an optimized integrated circuit.

Figure 3:
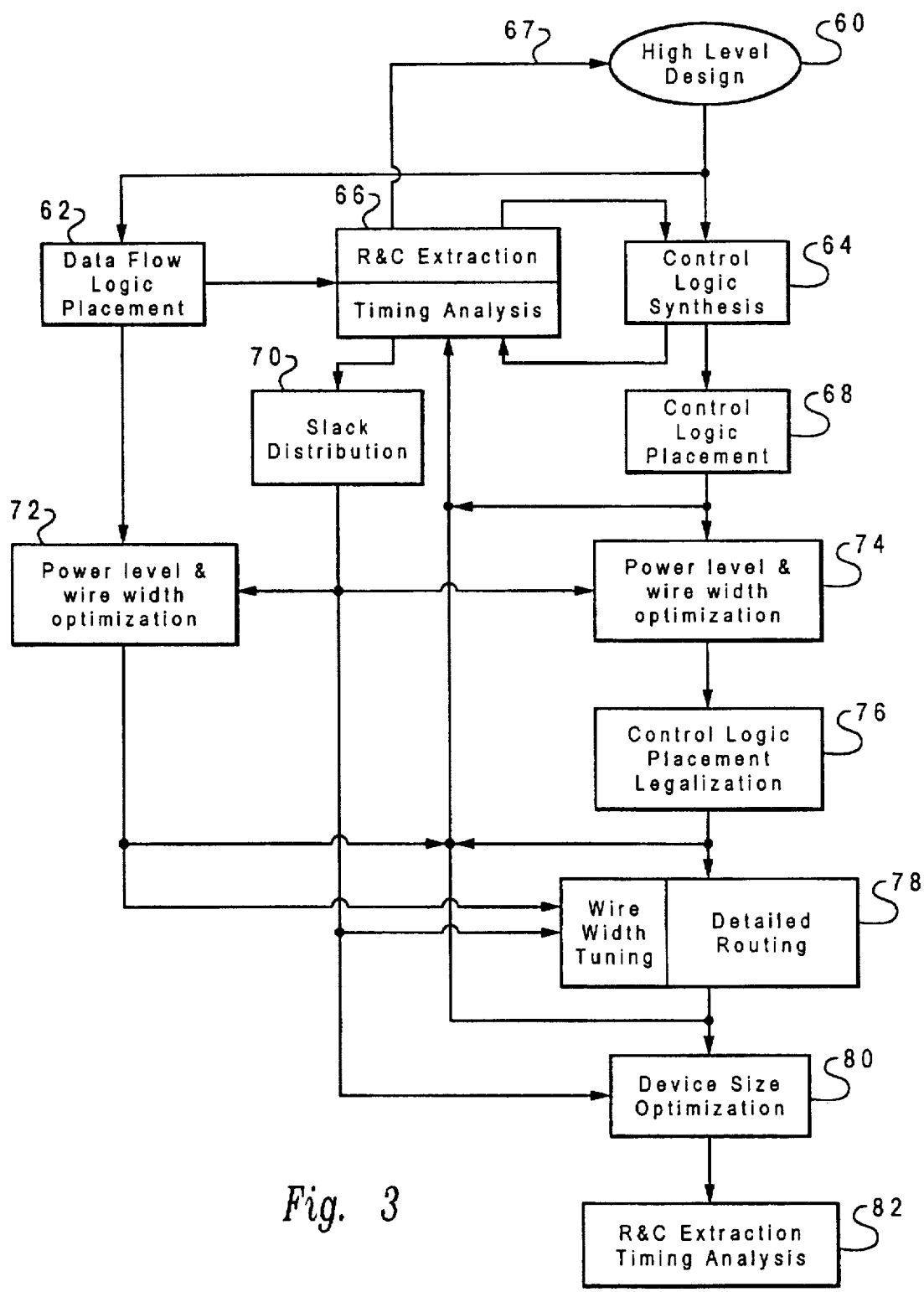
FIG. 3 is a flowchart illustrating a preferred embodiment of the process utilized by the present invention to design a layout of an integrated circuit.
Figure 4:
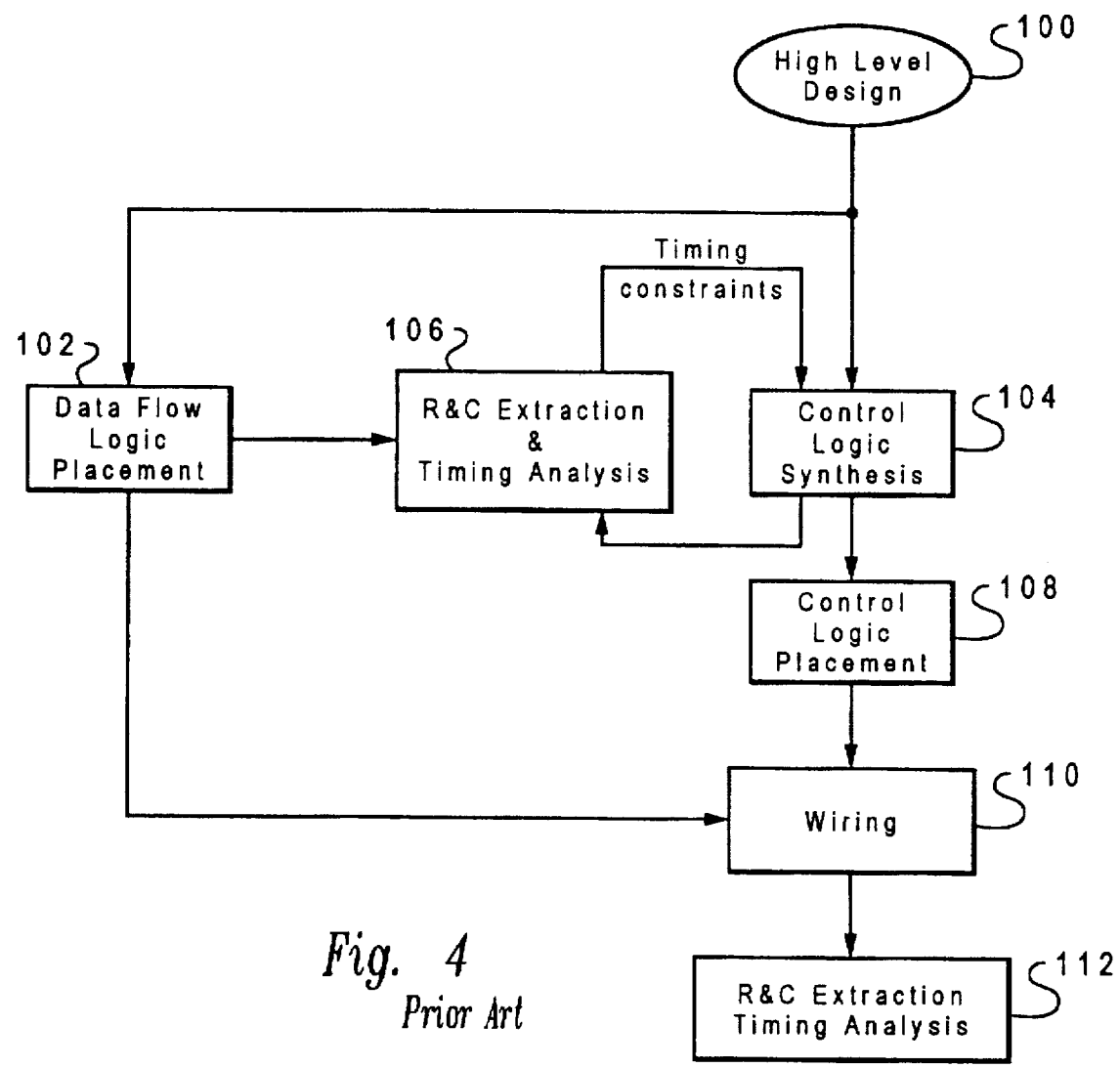
FIG. 4 is a flowchart depicting a conventional process for designing an integrated circuit.

With reference now to FIG. 3, there is illustrated a flowchart of the layout design process implemented by layout design software 52. As illustrated, the design process begins at block 60 when a user inputs a high-level functional description of the integrated circuit to be designed. As will be understood by those skilled in the art, high-level designs are typically described by OTS or custom macros calls, which specify particular data flow subcircuits, and Boolean equations, which define the control logic to be implemented. In addition to the high-level functional description, the user typically enters additional design constraints such as a maximum overall substrate area of the final circuit layout and a minimum performance benchmark. For example, if the integrated circuit to be designed is a microprocessor, the user might specify that the minimum performance for the microprocessor is 120 MHz at 3.3 watts and that the maximum available substrate area is 11.4 mm×7.5 mm.

The design process proceeds from block 60 to blocks 62 and 64, which depict data flow logic placement and control logic synthesis, respectively. Block 62 illustrates layout design software 52 arranging data flow subcircuits generated by the custom macro calls within the high-level design. As will be understood by those skilled in the art, because data flow logic within the high-level design is specified by macro calls which automatically generate custom or semi-custom data flow subcircuits, layout design software 52 need not generate the initial layout of the data flow subcircuits, but only arrange the data flow subcircuits within the user-specified substrate area.

As depicted at block 64, while the data flow subcircuits are arranged, control subcircuits are synthesized from Boolean equations utilizing RLMs. As illustrated, the design of each of the control subcircuits is iteratively refined utilizing timing data and resistance and capacitance values estimated by a timing tool at block 66. Following the synthesis of the control subcircuits at block 64, the performance characteristics of the initial substrate layout, including both the control and the data flow subcircuits, is estimated by the timing tool at block 66. The timing tool estimates not only the expected speed of the initial substrate layout, but also estimated resistance and capacitance values of the interconnects which link the data flow and control subcircuits comprising the integrated circuit. As illustrated by arrow 67, if the performance characteristic analysis performed at block 66 indicates that further refinements of the initial substrate layout will be unable to satisfy the user-specified performance requirements, layout design software 52 prompts the user to input a modified high-level design at block 60.

If the performance characteristic analysis at block 66 indicates that the user-specified performance requirements for the integrated circuit can be satisfied, the process proceeds to block 68, which illustrates arranging the control subcircuits synthesized at block 64. The control logic placement performed at block 68 is analogous to the data flow logic placement performed earlier at block 62. Because changing the estimated locations of the control subcircuits alters the estimated resistances and capacitances of the interconnects, the process then returns to block 66 to obtain a better estimate of the performance characteristics of the current circuit layout. Thus, at block 66 the speed, resistance, and capacitance characteristics of the circuit layout are again estimated by the timing tool. The results of the performance analysis depicted at block 66 are then input to slack distributor software illustrated at block 70.

The slack distributor utilizes the timing data from the performance analysis to identify a subset of the nets (i.e., circuit loops) within the circuit layout which are causing the greatest performance problems (i.e., the nets that exhibit "negative slack"). As will be appreciated by those skilled in the art, the nets identified by the slack distributor can be selected based upon a number of criteria, such as the estimated performance enhancement that can be realized by further refinement of the subcircuits and interconnect within a given net or the priority of resolving particular performance bottlenecks, such as memory accesses. In a preferred embodiment of the present invention, the number of nets selected by the slack distributor at block 70 is user-selectable to enable the user to balance the additional design time required to optimize marginal nets against the benefit gained by the optimization. The nets selected by the slack distributor are then provided as inputs to the power level and wire width optimization software illustrated at blocks 72 and 74.

As is well known to those skilled in the art, when the width of an interconnect is increased, the capacitance of the interconnect increases while the resistance of the interconnect decreases due to an increase in the cross-sectional area of current flow. Furthermore, it is well known to those skilled in the art that decreasing the resistance of an interconnect decreases the timing delay associated with the interconnect; however, increasing the capacitance of an interconnect tends to degrade the performance of the subcircuit driving the interconnect due to an increase in the load impedance of the driving subcircuit. Moreover, to maintain the performance of a driving subcircuit while increasing the load impedance, the power, and therefore size, of the driving subcircuit must be increased. Utilizing the foregoing design principles, the power level and wire width optimization software depicted at block 72 optimizes interconnect widths and power levels (sizes) of data flow subcircuits within nets containing data flow subcircuits; the power level and wire width optimization software performs a corresponding optimization of nets including control subcircuits at block 74. Thus, the optimization illustrated at block 74 balances the performance enhancement achieved by decreasing interconnect resistance (i.e., decreasing wire delay) with the performance degradation caused by increasing interconnect capacitance to maximize the overall performance of the integrated circuit layout. In a preferred embodiment of the present invention, the power level optimization performed at blocks 72 and 74 not only optimizes the power consumed by subcircuits within the integrated circuit layout to maximize overall circuit speed, but also ensures that the overall power consumed by the integrated circuit is less than the user-specified maximum amount.

As will be understood by those skilled in the art, the timing tool employed by layout design software 52 to analyze the performance of the integrated circuit at block 66 can be either a transistor-level timing tool or a so-called rules-based timing tool. Since transistor-level timing tools utilize timing models to simulate the operation of an integrated circuit that incorporate actual device sizes, changing the size of devices within the circuit layout creates little additional processing in CAD systems which employ transistor-level timing tools. In contrast, rules-based timing tools analyze integrated circuit timing behavior utilizing a timing behavior models that are device-size dependent. Thus, many conventional rules-based timing tools must generate new timing behavior models for each device within a circuit layout whose size is enlarged or reduced. To eliminate the necessity of generating a new timing behavior model for each device size optimization performed at blocks 72 and 74, a preferred embodiment of the present invention which utilizes a rules-based timing tool stores the device library utilized by the rules-based timing tool in parameterized format. Thus, when a device size is tuned at blocks 72 and 74 (or at block 80, as is described below), a new timing behavior model need not be generated since the change in device size can be accounted for within the integrated circuit model by changing selected parameters within the timing behavior model for that device.

Following the power level and wire width optimizations performed at blocks 72 and 74, the process proceeds to block 76, which illustrates control logic placement legalization. The control logic placement legalization performed at block 76 adjusts the control logic placement determined at block 68 to insure that control subcircuits do not overlap other subcircuits within the integrated circuit layout. Legalization of the control logic placement is necessary because the power level optimization performed at block 74 can potentially increase the size of control subcircuits to such an extent that the control subcircuits no longer fit within the constraints of the circuit layout. Thereafter, the timing tool again analyzes the performance characteristics of the integrated logic circuit at block 66.

As described above, following the performance analysis illustrated at block 66, the performance characteristics of the circuit layout are analyzed by the slack distributor at block 70 to select nets within the circuit layout which exhibit negative slack. The identity of the selected nets and the current circuit layout are then provided as inputs to block 78, which depicts finalizing the routing of each interconnect within the circuit layout. Because adjusting the interconnect routing can cause the resistive and capacitive characteristics of the interconnect to deviate beyond an acceptable amount from previously utilized estimates, wire width tuning is also performed at block 78 on the nets selected by the slack distributor in order to optimize the interconnect impedances and to thereby enhance overall performance of the integrated circuit. Thereafter, the performance of the integrated circuit layout is again analyzed at block 66. The results of the performance analysis are then provided to block 70, which illustrates the slack distributor identifying nets within the circuit layout which require further optimization.

Next, the process proceeds to block 80, which depicts performing a final optimization of device sizes within the nets identified by the slack distributor. The device size optimization performed at block 80 fine tunes only the sizes of devices within the selected nets while holding constant all other design variables such as subcircuit placement, subcircuit operating power levels, and interconnect routing.

Following block 80, the process terminates at block 82, which illustrates the timing tool verifying that the performance of the final integrated circuit layout meets or exceeds the user-defined performance requirements. As described above, the user-defined performance requirements can include not only the operating speed, but also the power requirements and size of resulting integrated circuit.

As has been described, the present invention provides an automated method and system for designing an integrated circuit which optimize the performance of the integrated circuit without requiring the use of customized subcircuits. According to the present invention, the final layout of an integrated circuit is optimized by iteratively refining individual subcircuits within an initial layout to achieve a user-specified performance benchmark.

While the invention has been particularly shown and described with reference to a preferred embodiment, it will be understood by those skilled in the art that various changes in form and detail may be made therein without departing from the spirit and scope of the invention.

What is claimed is:

1. An automated method for designing an integrated circuit, said method comprising:

in response to receipt of a high-level functional description of an integrated circuit including both control logic and data flow logic, constructing an initial substrate layout of said initial integrated circuit, said initial substrate layout including a plurality of subcircuits electrically connected by a plurality of interconnects, wherein said initial substrate layout is constructed based upon estimated timing characteristics of said plurality of subcircuits;

arranging particular ones of said plurality of subcircuits to optimize performance of said substrate layout of said integrated circuit, wherein said arrangement of particular ones of said plurality of subcircuits is performed independently for subcircuits implementing control logic and subcircuits implementing data flow logic;

determining performance characteristics of said substrate layout, including timing characteristics of said plurality of subcircuits and resistive and capacitive characteristics of said plurality of interconnects;

in response to a determination of said performance characteristics of said substrate layout, adjusting operating power levels of selected subcircuits among said plurality of subcircuits and resistances of selected ones of said plurality of interconnects to optimize performance of said substrate layout, wherein said adjustment of operating power levels of said selected subcircuits is performed independently for subcircuits implementing control logic and subcircuits implementing data flow logic;

thereafter, repeating said step of determining performance characteristics of said substrate layout; and in response to said repeated determination of said performance characteristics of said substrate layout, finalizing routing of said plurality of interconnects electrically connecting said plurality of subcircuits, wherein performance of said substrate layout of said integrated circuit is optimized by iteratively refining said initial substrate layout utilizing performance characteristic data.

2. The automated method for designing an integrated circuit of claim 1, and further comprising:

repeating said step of determining performance characteristics of said substrate layout; and in response to said repeated determination of said performance characteristics of said substrate layout, optimizing sizes of selected ones of said plurality of subcircuits utilizing as design constraints previously determined operating power levels and relative positions of said selected ones of said plurality of subcircuits and finalized routing of said plurality of interconnects.

3. The automated method for designing an integrated circuit of claim 1, and further comprising:

determining if a performance characteristic of said initial substrate layout exceeds a predetermined benchmark; and in response to a failure of said performance characteristic of said initial substrate layout to exceed said predetermined benchmark, revising said high-level functional description.

4. The automated method for designing an integrated circuit of claim 1, wherein said integrated circuit is subject to a design constraint of a maximum substrate area, said method further comprising:

subsequent to said step of adjusting operating power levels of selected subcircuits among said plurality of subcircuits, verifying that all of said plurality of subcircuits fit within said maximum substrate area without overlap.

5. The automated method for designing an integrated circuit of claim 1, wherein said step of finalizing routing of said plurality of interconnects further comprises tuning resistances of particular ones of said plurality of interconnects.

6. The automated method for designing an integrated circuit of claim 5, wherein said steps of adjusting resistances of selected ones of said plurality of interconnects and tuning resistances of said particular ones of said plurality of interconnects comprise adjusting widths of said selected ones and said particular ones of said plurality of interconnects.

7. The automated method for designing an integrated circuit of claim 1, and further comprising verifying performance of said final substrate layout of said integrated circuit.

8. The automated method for designing an integrated circuit of claim 1, and further comprising:

choosing said selected subcircuits from among said plurality of subcircuits in response to a determination of said performance characteristic of said substrate layout, said performance characteristic of said substrate layout specifying an estimated performance for each of said plurality of subcircuits, wherein each of said selected subcircuits among said plurality of subcircuits exhibits a proportionally greater deviation from a maximum ideal performance than nonselected subcircuits among said plurality of subcircuits.

9. An automated system for designing an integrated circuit, said system comprising:

means for constructing an initial substrate layout of an integrated circuit in response to receipt of a high-level functional description of said integrated circuit including both control logic and data flow logic, said initial substrate layout including a plurality of subcircuits electrically connected by a plurality of interconnects, wherein said initial substrate layout is constructed based upon estimated timing characteristics of said plurality of subcircuits;

means for arranging particular ones of said plurality of subcircuits to optimize performance of said substrate layout of said integrated circuit, wherein said means for arranging particular ones of said plurality of subcircuits operates on subcircuits implementing control logic independently of subcircuits implementing data flow logic;

means for determining performance characteristics of said substrate layout, including timing characteristics of said plurality of subcircuits and resistive and capacitive characteristics of said plurality of interconnects;

means for adjusting operating power levels of selected subcircuits among said plurality of subcircuits and resistances of selected ones of said plurality of interconnects to optimize performance of said substrate layout in response to a determination of said performance characteristics of said substrate layout, wherein said means for adjusting operating power levels of selected subcircuits operates on subcircuits implementing control logic independently of subcircuits implementing data flow logic;

means for thereafter repeating said determination of performance characteristics of said substrate layout; and means for finalizing routing of said plurality of interconnects electrically connecting said plurality of subcircuits in response to said repeated determination of said performance characteristics of said substrate layout, wherein performance of said substrate layout of said integrated circuit is optimized by iteratively refining said initial substrate layout utilizing performance characteristic data.

10. The automated system for designing an integrated circuit of claim 9, and further comprising:

means for repeating said means for determining performance characteristics of said substrate layout; and means, responsive to said repeated determination of said performance characteristics of said substrate layout, for optimizing sizes of selected ones of said plurality of subcircuits utilizing as design constraints previously determined operating power levels and relative positions of said selected ones of said plurality of subcircuits and finalized routing of said plurality of interconnects.

11. The automated system for designing an integrated circuit of claim 9, and further comprising:

means for determining if a performance characteristic of said initial substrate layout exceeds a predetermined benchmark; and means for revising said high-level functional description in response to a failure of said performance characteristic of said initial substrate layout to exceed said predetermined benchmark.

12. The automated system for designing an integrated circuit of claim 9, wherein said integrated circuit is subject to a design constraint of a maximum substrate area, said system further comprising:

means for verifying that all of said plurality of subcircuits fit within said maximum substrate area without overlap subsequent to adjusting operating power levels of selected subcircuits among said plurality of subcircuits.

13. The automated system for designing an integrated circuit of claim 9, wherein said means for finalizing routing of said plurality of interconnects further comprises means for tuning resistances of particular ones of said plurality of interconnects.

14. The automated system for designing an integrated circuit of claim 13, wherein said means for adjusting resistances of selected ones of said plurality of interconnects and means for tuning resistances of said particular ones of said plurality of interconnects comprise means for adjusting widths of said selected ones and said particular ones of said plurality of interconnects.

15. The automated system for designing an integrated circuit of claim 9, and further comprising means for verifying performance of said final substrate layout of said integrated circuit.

16. The automated system for designing an integrated circuit of claim 9, and further comprising:

means for choosing said selected subcircuits from among said plurality of subcircuits in response to a determination of said performance characteristic of said substrate layout, said performance characteristic of said substrate layout specifying an estimated performance for each of said plurality of subcircuits, wherein each of said selected subcircuits among said plurality of subcircuits exhibits a proportionally greater deviation from a maximum ideal performance than nonselected subcircuits among said plurality of subcircuits.

17. A computer program product stored on a computer readable media for causing a data processing system to design an integrated circuit, said computer program product comprising:

instruction means for causing said data processing system to construct an initial substrate layout of an integrated circuit in response to receipt of a high-level functional description of said integrated circuit including both control logic and data flow logic, said initial substrate layout including a plurality of subcircuits electrically connected by a plurality of interconnects, wherein said initial substrate layout is constructed based upon estimated timing characteristics of said plurality of subcircuits;

instruction means for causing said data processing system to arrange particular ones of said plurality of subcircuits to optimize performance of said substrate layout of said integrated circuit, wherein said instruction means for causing said data processing system to arrange particular ones of said plurality of subcircuits operates on subcircuits implementing control logic independently of subcircuits implementing data flow logic;

instruction means for causing said data processing system to determine performance characteristics of said substrate layout, including timing characteristics of said plurality of subcircuits and resistive and capacitive characteristics of said plurality of interconnects;

instruction means for causing said data processing system to adjust operating power levels of selected subcircuits among said plurality of subcircuits and resistances of selected ones of said plurality of interconnects to optimize performance of said substrate layout in response to a determination of said performance characteristics of said substrate layout, wherein said instruction means for causing said data processing system to adjust operating lower levels of selected subcircuits among said plurality of subcircuits operates on subcircuits implementing control logic independently of subcircuits implementing data flow logic;

instruction means for causing said data processing system to thereafter repeat said determination of performance characteristics of said substrate layout; and instruction means for causing said data processing system to finalize routing of said plurality of interconnects electrically connecting said plurality of subcircuits in response to said repeated determination of said performance characteristics of said substrate layout, wherein performance of said substrate layout of said integrated circuit is optimized by iteratively refining said initial substrate layout utilizing performance characteristic data.

18. The computer program product of claim 17, and further comprising:

instruction means for causing said data processing system to repeat said determination of performance characteristics of said substrate layout; and instruction means, responsive to said repeated determination of said performance characteristics of said substrate layout, for causing said data processing system to optimize sizes of selected ones of said plurality of subcircuits utilizing as design constraints previously determined operating power levels and relative positions of said selected ones of said plurality of subcircuits and finalized routing of said plurality of interconnects.

19. The computer program product of claim 17, and further comprising:

instruction means for causing said data processing system to determine if a performance characteristic of said initial substrate layout exceeds a predetermined benchmark; and instruction means for causing said data processing system to revise said high-level functional description in response to a failure of said performance characteristic of said initial substrate layout to exceed said predetermined benchmark.

20. The computer program product of claim 17, wherein said integrated circuit is subject to a design constraint of a maximum substrate area, said computer program product further comprising:

instruction means for causing said data processing system to verify that all of said plurality of subcircuits fit within said maximum substrate area without overlap subsequent to adjusting operating power levels of selected subcircuits among said plurality of subcircuits.

21. The computer program product of claim 17, wherein said instruction means for finalizing routing of said plurality of interconnects further comprises instruction means for causing said data processing system to tune resistances of particular ones of said plurality of interconnects.

22. The computer program product of claim 21, wherein said instruction means for adjusting resistances of selected ones of said plurality of interconnects and instruction means for tuning resistances of said particular ones of said plurality of interconnects comprise instruction means for causing said data processing system to adjust widths of said selected ones and said particular ones of said plurality of interconnects.

23. The computer program product of claim 17, and further comprising instruction means for causing said data processing system to verify performance of said final substrate layout of said integrated circuit.

24. The computer program product of claim 17, and further comprising:

instruction means for causing said data processing system to choose said selected subcircuits from among said plurality of subcircuits in response to a determination of said performance characteristic of said substrate layout, said performance characteristic of said substrate layout specifying an estimated performance for each of said plurality of subcircuits, wherein each of said selected subcircuits among said plurality of subcircuits exhibits a proportionally greater deviation from a maximum ideal performance than nonselected subcircuits among said plurality of subcircuits.

* * * * *

UNITED STATES PATENT AND TRADEMARK OFFICE
CERTIFICATE OF CORRECTION

PATENT NO. : 5,764,532
DATED : June 9, 1998
INVENTOR(S) : Patel

It is certified that error appears in the above-indentified patent and that said Letters Patent is hereby corrected as shown below:

At column 10, line 33 please change "lower" to --power--.

Signed and Sealed this

Thirteenth Day of October 1998

Attest:

BRUCE LEHMAN

Attesting Officer

Commissioner of Patents and Trademarks